US012249582B2

(12) United States Patent
Lin et al.

(10) Patent No.: US 12,249,582 B2
(45) Date of Patent: Mar. 11, 2025

(54) SIP PACKAGE STRUCTURE

(71) Applicant: JCET GROUP CO., LTD., Wuxi (CN)

(72) Inventors: Yaojian Lin, Wuxi (CN); Xueqing Chen, Wuxi (CN); Shasha Zhou, Wuxi (CN); Jian Chen, Wuxi (CN); Shuo Liu, Wuxi (CN); Danfeng Yang, Wuxi (CN)

(73) Assignee: JCET GROUP CO., LTD., Wuxi (CN)

( * ) Notice: Subject to any disclaimer, the term of this patent is extended or adjusted under 35 U.S.C. 154(b) by 528 days.

(21) Appl. No.: 17/613,053

(22) PCT Filed: May 20, 2020

(86) PCT No.: PCT/CN2020/091227
§ 371 (c)(1),
(2) Date: Nov. 20, 2021

(87) PCT Pub. No.: WO2021/008228
PCT Pub. Date: Jan. 21, 2021

(65) Prior Publication Data
US 2022/0223539 A1      Jul. 14, 2022

(30) Foreign Application Priority Data

Jul. 16, 2019   (CN) .......................... 201910641045.X (51) Int. Cl.
| | | |
|---|---|---|
| H01L 23/552 | (2006.01) |
| H01L 23/31 | (2006.01) |
| H01L 23/498 | (2006.01) |
| H01L 23/538 | (2006.01) |
| H01L 25/18 | (2023.01) |

(52) U.S. Cl.
CPC ........ *H01L 23/552* (2013.01); *H01L 23/3107* (2013.01); *H01L 23/49822* (2013.01); *H01L 23/5385* (2013.01); *H01L 25/18* (2013.01)

(58) Field of Classification Search
None
See application file for complete search history.

(56) References Cited

U.S. PATENT DOCUMENTS 10,141,268 B2 * 11/2018 Figueredo ............. H01L 23/552
10,468,384 B2 * 11/2019 Yang ..................... H01L 23/538
(Continued)

FOREIGN PATENT DOCUMENTS

| | | |
|---|---|---|
| CN | 106298741 A | 1/2017 |
| CN | 108417563 A | 8/2018 |
| CN | 109509722 A | 3/2019 |

*Primary Examiner* — Long Pham
(74) *Attorney, Agent, or Firm* — MUNCY, GEISSLER, OLDS & LOWE, P.C.

(57) ABSTRACT

The present invention provides an SIP package structure. The SIP package structure comprises a first module, a second module and a shielding assembly, wherein the first module and the second module are horizontally distributed or vertically stacked; electromagnetic sensitive frequencies of the first module and the second module are different; the shielding assembly comprises a first shielding structure covering the first module and a second shielding structure covering the second module; and at least part of the first shielding structure and/or at least part of the second shielding structure are/is disposed between the first module and the second module.

16 Claims, 5 Drawing Sheets

(56) References Cited

U.S. PATENT DOCUMENTS

| | | | |
|---|---|---|---|
| 11,189,598 B2* | 11/2021 | Yang | H01L 25/0657 |
| 2012/0182706 A1* | 7/2012 | Siomkos | H01L 23/552 |
| | | | 361/803 |
| 2014/0062607 A1* | 3/2014 | Nair | H01L 23/5389 |
| | | | 361/679.02 |
| 2015/0333018 A1 | 11/2015 | Kim et al. | |
| 2019/0088621 A1* | 3/2019 | Yang | H01L 23/5385 |
| 2020/0006295 A1* | 1/2020 | Yang | H01L 24/11 |
| 2022/0367381 A1* | 11/2022 | Kim | H01L 25/16 |
| 2024/0021536 A1* | 1/2024 | Kim | H01L 21/561 |
| 2024/0030154 A1* | 1/2024 | Lee | H01L 25/165 |

* cited by examiner

SIP PACKAGE STRUCTURE

FIELD OF THE INVENTION

The present invention relates to the field of semiconductor package technologies, and in particular, to an SIP package structure that is provided with an embedded electromagnetic interference (EMI) shield, thereby meeting different electromagnetic shielding requirements for different secondary modules or SOC chips.

BACKGROUND OF THE INVENTION

With the development of semiconductor technologies, particularly the advent of the 5G communication era, electronic devices need to become increasingly miniaturized and thinned, and a demand for heterogeneous integration of different elements becomes increasingly great. As a result, system level package (SIP) for heterogeneous integration of semiconductors has gradually become a trend of package.

The development of heterogeneous integration requires high density, miniaturization and multi-dimension to meet requirements of multi-frequency and multi-bandwidth applications. However, different secondary modules or SOC (system on a chip) chips may have different sensitivities and requirements for interference of different electromagnetic frequencies. For example, a pressure-sensitive device, such as a board-to-board connector (B2B connector) or an optoelectronic connector, needs to be separated from an electromagnetically shielded module and cannot be completely packaged with plastics. A current SIP package structure cannot meet all electromagnetic shielding requirements for different secondary modules or SOC, chips.

In view of this, it is necessary to provide an improved SIP package structure to resolve the above problem.

BRIEF DESCRIPTION OF THE INVENTION

An objective of the present invention is to provide an SIP package structure that is provided with an embedded EMI shield, thereby meeting different electromagnetic shielding requirements for different secondary modules or SOC chips.

To implement the above inventive objective, the following technical solution is used in the present invention.

An SIP package structure, comprising a first module and a second module, the first module and the second module are horizontally distributed or vertically stacked, electromagnetic sensitive frequencies of the first module and the second module are different; the SIP package structure further comprises a shielding assembly; the shielding assembly comprises a first shielding structure covering the first module and a second shielding structure covering the second module; and at least part of the first shielding structure and/or at least part of the second shielding structure are/is disposed between the first module and the second module.

As a further improvement of the present invention, the first shielding structure and the second shielding structure are made of different materials, or the first shielding structure and the second shielding structure have different structures, or the first shielding structure and the second shielding structure are made of different materials and have different structures.

As a further improvement of the present invention, the second module is disposed on a front side of the first module; and at least part of the first shielding structure is disposed between the first module and the second module.

As a further improvement of the present invention, the first shielding structure is electrically connected to the second shielding structure; and the first shielding structure and/or the second shielding structure are/is provided with at least one grounding point.

As a further improvement of the present invention, the first module comprises a first substrate, a third substrate, a first functional element, a first peripheral element and a first plastic packaging structure, wherein the first functional element, the first substrate and the first peripheral element are disposed on the third substrate; the first plastic packaging structure encapsulates the first functional element, the first peripheral element and the first substrate; and the first shielding structure comprises a shielding metal layer disposed on a front side of the first plastic packaging structure;

the second module comprises a second substrate, a second functional element, a second peripheral element and a second plastic packaging structure, wherein the second functional element and the second peripheral element are disposed on a front side of the second substrate; the second plastic packaging structure encapsulates the second functional element and the second peripheral element; and the second shielding structure covers the second plastic packaging structure; and the shielding metal layer is electrically connected to the first substrate; and/or the shielding metal layer is electrically connected to the second substrate.

As a further improvement of the present invention, wherein the first shielding structure comprises a shielding metal layer disposed between the first module and the second module; the second shielding structure further comprises an additional shielding structure capable of covering part of a lateral side of the first module; and the additional shielding structure is electrically connected to the shielding metal layer.

As a further improvement of the present invention, wherein the first shielding structure comprises a shielding metal layer disposed between the first module and the second module; and the second shielding structure covers a front side and a lateral side of the second module; and an end part of the second shielding structure is electrically connected to the shielding metal layer, or the shielding assembly further comprises a conductive adhesive that electrically connects the shielding metal layer to the second shielding structure covering the lateral side of the second module.

As a further improvement of the present invention, each of the first shielding structure and the second shielding structure is provided with at least one grounding point.

As a further improvement of the present invention, the first module comprises a first substrate, a third substrate, a first functional element, a first peripheral element and a first plastic packaging structure, wherein the first functional element, the first substrate and the first peripheral element are disposed on the third substrate; and the first plastic packaging structure encapsulates the first functional element, the first peripheral element and the first substrate;

the second module comprises a second substrate, a second functional element, a second peripheral element and a second plastic packaging structure, wherein the second functional element and the second peripheral element are disposed on a front side of the second substrate; and the second plastic packaging structure encapsulates the second functional element and the second peripheral element; and the first shielding structure comprises a shielding metal layer disposed on a front side of the first plastic packaging structure; at least one of the first substrate and the second substrate is electrically connected to the shielding metal layer; and the second shielding structure covers the second plastic packaging structure and is electrically connected to the second substrate.

As a further improvement of the present invention, the first module comprises a first substrate, a third substrate, a first functional element, a first peripheral element and a first plastic packaging structure, wherein the first functional element, the first substrate and the first peripheral element are disposed on the third substrate; and the first plastic packaging structure encapsulates the first functional element, the first peripheral element and the first substrate;

the second module comprises a second substrate, a second functional element, a second peripheral element and a second plastic packaging structure, wherein the second functional element and the second peripheral element are disposed on a front side of the second substrate; the second plastic packaging structure encapsulates the second functional element and the second peripheral element; and the second shielding structure covers the second plastic packaging structure and is electrically connected to the second substrate;

the first substrate is connected to the second substrate via at least one first solder ball; and the first shielding structure comprises at least one of a shielding metal layer disposed on a front side of the first plastic packaging structure, at least part of the second substrate, or at least one solder ball for electrically connecting the first substrate to the second substrate.

As a further improvement of the present invention, the first module comprises a first substrate, a third substrate, a first functional element, a first peripheral element and a first plastic packaging structure, wherein the first functional element, the first substrate and the first peripheral element are disposed on the third substrate; and the first plastic packaging structure encapsulates the first functional element, the first peripheral element and the first substrate;

the second module comprises a second substrate, a second functional element, a second peripheral element and a second plastic packaging structure, wherein the second functional element and the second peripheral element are disposed on a front side of the second substrate; and the second plastic packaging structure encapsulates the second functional element and the second peripheral element;

the first substrate is connected to the second substrate via at least one first solder ball; and at least one third solder ball is disposed on a back side of the third substrate.

As a further improvement of the present invention, the first module comprises a third substrate, a first functional element, a first peripheral element and a first plastic packaging structure, wherein the first functional element and the first peripheral element are disposed on the third substrate; and the first plastic packaging structure encapsulates the first functional element and the first peripheral element;

the second module comprises a second substrate, a second functional element, a second peripheral element and a second plastic packaging structure, wherein the second functional element and the second peripheral element are disposed on a front side of the second substrate; and the second plastic packaging structure encapsulates the second functional element and the second peripheral element; and the third substrate and the second substrate are electrically connected to each other via a first metal adapter pillar.

As a further improvement of the present invention, the first plastic packaging structure further covers a lateral side of the third substrate; and a width of the first plastic packaging structure disposed on the lateral side of the third substrate is not less than 70 μm.

As a further improvement of the present invention, the SIP package structure further comprises a third peripheral element disposed on the back side of the third substrate.

As a further improvement of the present invention, the first module comprises a first substrate, a third substrate, a first functional element, a first peripheral element and a first plastic packaging structure, wherein the first functional element, the first substrate and the first peripheral element are disposed on the third substrate; and the first plastic packaging structure encapsulates the first functional element and the first peripheral element; and the first substrate comprises an extending substrate extending out of the first plastic packaging structure; and the SIP package structure further comprises an external package body that is disposed on the extending substrate and/or a functional element that does not need to be packaged with plastics.

As a further improvement of the present invention, the shielding assembly further comprises a third shielding structure that covers the external package body and/or the functional element that does not need to be packaged with plastics; and at least one of the first shielding structure or the second shielding structure is electrically connected to the third shielding structure.

Compared with the prior art, the present invention has the following benefits: for the SIP package structure according to the present invention, modules and devices that have different frequency sensitivities are respectively processed by using different electromagnetic shielding technologies, then horizontally or vertically stacked, and finally packaged in an integrated manner. Therefore, different electromagnetic shielding requirements for different secondary modules or SOC chips are met, and the overall structure is compact.

DETAILED DESCRIPTION

The present invention will be described in detail below with reference to the specific embodiments shown in the accompanying drawings. However, these embodiments are not intended to limit the present invention. All modifications in structures, methods, or functions made by those of ordinary skill in the art according to these embodiments are comprised in the protection scope of the present invention.

In each figure of the present invention, to facilitate illustration, sizes of some structures or parts may be exaggerated relative to those of other structures or parts. Therefore, the figures are merely used for showing the basic structure of the subject of the present invention.

In addition, "and/or" used herein represents "or" or "and". For example, "M and/or N" may indicate three cases: only Ml exists, only N exists, and both M and N exist.

Referring to FIGS. 1 to 5, which show an SIP package structure 100 according to preferred embodiments of the present invention. The SIP package structure 100 comprises at least a first module 1, a second module 2 with an electromagnetic sensitive frequency different from that of the first module 1, and a shielding assembly 4. The shielding assembly 4 is configured to form an EMI shield of the SHP package structure 100, thereby preventing interference of external electromagnetic signals and magnetic flux leakage interference between different modules.

The first module 1 is a main module, and comprises a first substrate 11, a third substrate 3, a first functional element 12, a first peripheral element 13 and a first plastic packaging structure 14. The first functional element 12, the first substrate 11 and the first peripheral element 13 are disposed on the third substrate 3, for example, on a front side of the third substrate 3. The first plastic packaging structure 14 encapsulates the first functional element 12, the first peripheral element 13 and the first substrate 11.

Figure 1:
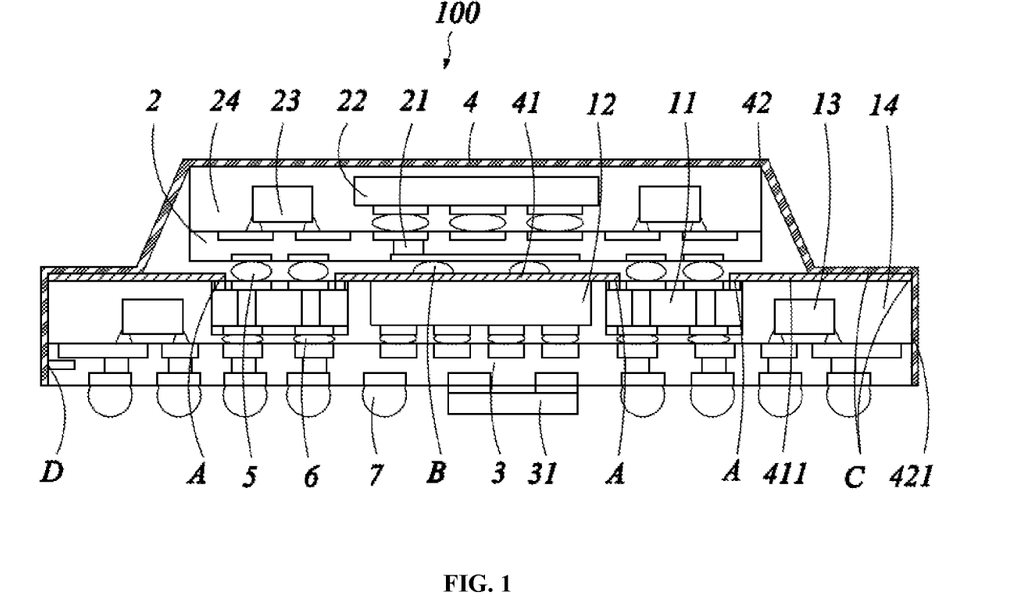
FIG. 1 is a schematic diagram of an SIP package structure according to a preferred embodiment of the present invention.
Figure 2:
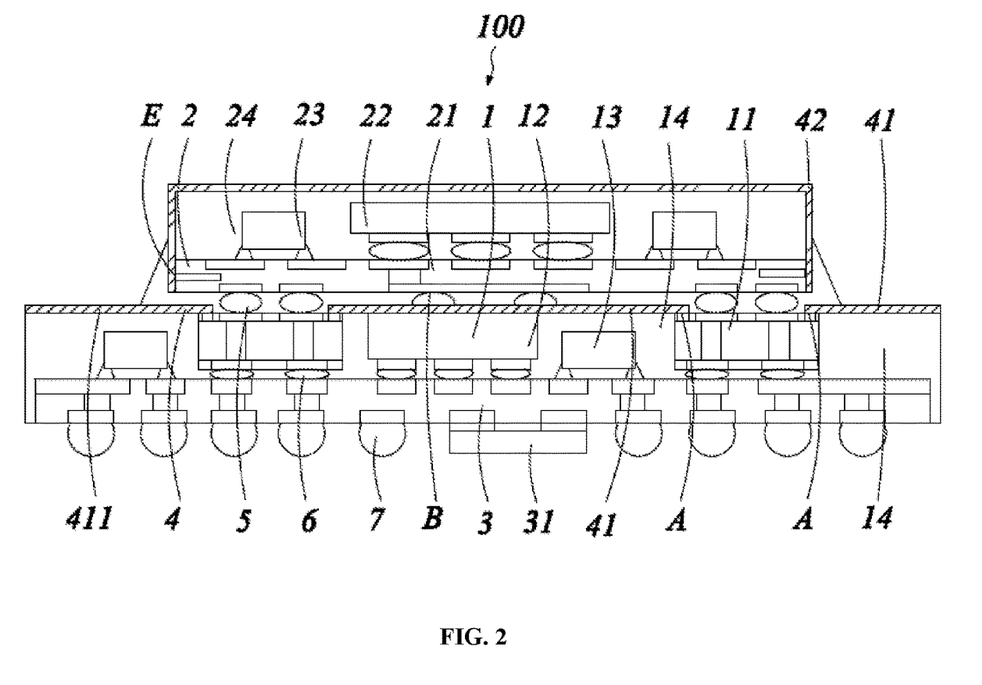
FIG. 2 is a schematic diagram of an SIP package structure according to another preferred embodiment of the present invention.

Specifically, as shown in FIGS. 1 and 2, the first functional element 12 is built in an inner side of the first substrate 11, and is disposed, together with the first substrate 11 and the first peripheral element 13, on a front-side pad of the third substrate 3 for reflow bonding. Alternatively, the first functional element 12 and the first peripheral element 13 may be respectively attached to the inner side or an outer side of the first substrate 11.

In another process and structure, the first functional element 12 is embedded in the inner side of the first substrate 11, and may be pre-embedded in a molding compound together with the first substrate 11, wherein substrate-level embedment and wafer-level embedment are adopted. In addition, optional processes of re-wring and convex formation (also referred to as a fan-out process) are performed. Then, a back-side metal pad. Of the first substrate 11 is exposed. Finally, after cutting and inspection are performed, the first functional element 12, together with the first peripheral element 13, is bonded with the front-side pad of the third substrate 3. Therefore, a volume of the first module 1 can be greatly reduced.

Further, as shown in FIG. 2, the first module 1 further comprises a first peripheral element 13 that is built in the inner side of the first substrate 11 and at a periphery of the first functional element 12. In addition, the first peripheral element 13 is disposed adjacent to the first functional element 12. Alternatively, as shown in FIG. 1 and FIGS. 3 to 5, the first peripheral element 13 and the first functional element 12 are separated by part of the first substrate 11 or a first metal adapter pillar 8.

The second module 2 comprises a second substrate 21, a second functional element 22, a second peripheral element 23 and a second plastic packaging structure 24. The second functional element 22 and the second peripheral element 23 are disposed on a front side of the second substrate 21. The second plastic packaging structure 24 encapsulates the second functional element 22 and the second peripheral element 23.

The third substrate 3 and the second substrate 21 may be substrates of organic homogeneous or heterogeneous layers, and be made of glass fiber and/or an inorganic filler, and corresponding resin. In addition, the first substrate 11 and the second substrate 21 may also be redistribution layers of a circuit, and comprise organic dielectric materials and metal circuits of homogeneous or heterogeneous layers.

The first functional element 12 and the second functional element 22 are active devices, or referred to as active elements, and comprising but limited to common functional elements such as chips or secondary modules. The first peripheral element 13 and the second peripheral element 23 are passive devices, or referred to as passive elements, and comprise but not limited to resistors, capacitors, inductors and the like. Generally, the peripheral elements are disposed at peripheries of the functional elements, so that the SIP package structure 100 is compact overall.

The shielding assembly 4 comprises a first shielding structure 41 covering the first module 1 and a second shielding structure 42 covering the second module 2. At least part of the first shielding structure 41 and at least part of the second shielding structure 42 are grounded. In other words, each of the first shielding structure 41 and the second shielding structure 42 is provided with at least one grounding point. In this way, an excellent electromagnetic shielding effect can be achieved.

Those skilled in the art may understand that the first shielding structure 41 covers the first module 1 in the following two manners: the first shielding structure 41 is in direct contact with the first functional element 12 and the first peripheral element 13, or the first shielding structure 41 is separated from the first functional element 12 and the first peripheral element 13 by the first plastic packaging structure 14. The two manners can achieve a good electromagnetic shielding effect. Similarly, the second shielding structure 42 covers the second module 2 in the following two manners: the second shielding structure 42 is in direct contact with the second functional element 22 and the second peripheral element 23, or the second shielding structure 42 is separated from the second functional element 22 and the second peripheral element 23 by the second plastic packaging structure 24.

The first shielding structure 41 and the second shielding structure 42 are made of different materials, or the first shielding structure 41 and the second shielding structure 42 have different structures, or the first shielding structure 41 and the second shielding structure 42 are made of different materials and have different structures. Owing to overall coordination of structures and materials, the first shielding structure 41 and the second shielding structure 42 that have different electromagnetic shielding effects are formed, so that different types of electromagnetic shielding can be performed for modules that are sensitive to different electromagnetic frequencies, thereby meeting the electromagnetic shielding requirements of the whole SIP package structure 100.

Specifically, appropriate materials and/or structures are selected for the first shielding structure 41 and the second shielding structure 42 respectively based on frequencies that the first module 1 and the second module 2 need to shield. For example, the first shielding structure 41 and the second shielding structure 42 that are required are formed by sputtering or spraying a high-frequency shielding coating and a low-frequency shielding coating.

According to the requirements of different product dimensions, the first module 1 and the second module 2 may be arranged horizontally or vertically. At least part of the shielding assembly 4 is embedded in the SIP package structure 100. Therefore, different EMI shielding effects are achieved for different modules. Specifically, at least part of the first shielding structure 41 and/or at least part of the second shielding structure 42 are disposed between the first module 1 and the second module 2, thereby achieving different shielding effects on the first module 1 and the second module 2, and preventing magnetic flux leakage between the first module 1 and the second module 2.

As shown in FIGS. 1 to 5, based on all the above structural descriptions, the design of the shielding assembly 4 of the SIP package structure 100 according to the present invention is described by using an example in which the first module 1 and the second module 2 are vertically stacked.

The second module 2 is disposed on a front side of the first module 1. The second module 2 and the first module 1 are vertically stacked. There is a filling adhesive between the first substrate 11 and the second substrate 21. The first substrate 11 is connected to the second substrate 21 via at least one first solder ball 5.

Further, the SIP package structure 100 further comprises a third substrate 3 disposed on a back side of the first substrate 11. At least one third solder ball 7 is disposed on a back side of the third substrate 3. The third solder ball 7 is used as an integrated input/output terminal of the SIP package structure 100 and is used for providing a power supply, transmitting signals, grounding and the like.

Figure 3:
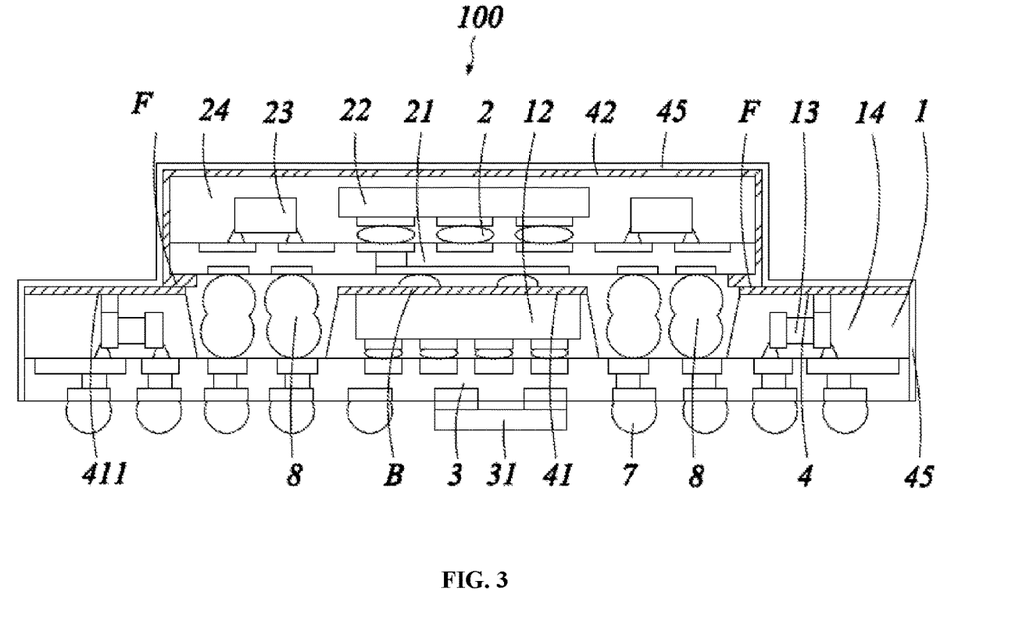
FIG. 3 is a schematic diagram of an SIP package structure according to still another preferred embodiment of the present invention.

In the case that the SIP package structure 100 comprises the third substrate 3, as shown in FIG. 1, 2, 4, or 5, the third substrate 3 is electrically connected to the first substrate 11 via at least one second solder ball 6. Alternatively, as shown in FIG. 3, the third substrate 3 and the second substrate 21 are electrically connected to each other via the first metal adapter pillar 8, thereby implementing electrical connection between an upper module and a lower module as well as grounding of part of the shielding assembly 4. In some designs, the second substrate 21 or the third substrate 3 may not exist, and bonding connection is implemented by directly using a tin ball, a metal bump, or another metal structure.

As shown in FIG. 2, the first plastic packaging structure 14 further covers a lateral side of the third substrate 3. Preferably, a width of the first plastic packaging structure 14 located on the lateral side of the third substrate 3 is not less than 70 μm, which can improve the stability of the entire SIP package structure 100.

The SIP package structure 100 further comprises a third peripheral element 31 selectively disposed on the back side of the third substrate 3, that is, the third peripheral element 31 may be disposed as shown in FIGS. 1 to 5, or may not be provided.

In addition, in an embodiment in which the SIP package structure 100 comprises the third substrate 3, the first peripheral element 13 may also be attached to the third substrate 3. Then, the first substrate 11 in which the first functional element 12 is built in and the third substrate 3 are pressed together. Both this disposing manner and a manner of disposing the first peripheral element 13 in the first substrate 11 as described above do not affect implementation of the first functional element 12. Alternatively, as shown in FIG. 3, the first substrate 11 may not be disposed, and both the first functional element 12 and the first peripheral element 13 are attached to the third substrate 3.

At least part of the first shielding structure 41 is disposed between the first module 1 and the second module 2. In other words, at least part of the first shielding structure 41 is embedded in the SIP package structure 100 to perform electromagnetic shielding on the first module 1. In this case, the first shielding structure 41 may be a shielding metal layer 411 disposed on the front side of the first plastic packaging structure. The shielding metal layer 411 comprises a shielding metal coating or a shielding metal sheet, or may be part of the second substrate 21, or a bonding point, such as at least one solder ball for electrically connecting the first substrate 11 to the second substrate 21.

Further, in some embodiments, the first shielding structure 41 is electrically connected to the second shielding structure 42; and the first shielding structure 41 and/or the second shielding structure 42 are/is provided with at least one grounding point. Therefore, relatively strong overall protection for EMI grounding and electromagnetic shielding can be implemented.

Specifically, the first shielding structure 41 comprises the shielding metal layer 411 disposed between the first module 1 and the second module 2. The shielding metal layer 411 is disposed on the front side of the first plastic packaging structure 14. The shielding metal layer 411 is electrically connected to the first substrate 11, and/or the shielding metal layer 411 is electrically connected to the second substrate 21. In other words, at least one of the first substrate 11 and the second substrate 21 is in electrical contact with the shielding metal layer 411, so that at least one point of the first shielding structure 41 is grounded, thereby implementing the grounding of the entire shielding assembly 4. A person skilled in the art may understand that the shielding metal layer 411 being electrically connected to the first substrate 11 and the second substrate 21 means that the shielding metal layer 411 is electrically connected to grounding wires of the substrates.

Manners in which the first shielding structure 41 is electrically connected to the second shielding structure 42 comprises but limited to the followings.

As shown in FIG. 1, the first shielding structure 41 comprises the shielding metal layer 411 disposed between the first module 1 and the second module 2. The second shielding structure 42 further comprises an additional shielding structure 421 capable of covering part of a lateral side of the first module 1. The additional shielding structure 421 is electrically connected to the shielding metal layer 411, thereby implementing highly integral high-reliability grounding and high bonding performance, implementing an integral shielding design of a product, and improving EMC performance of the product.

Figure 4:
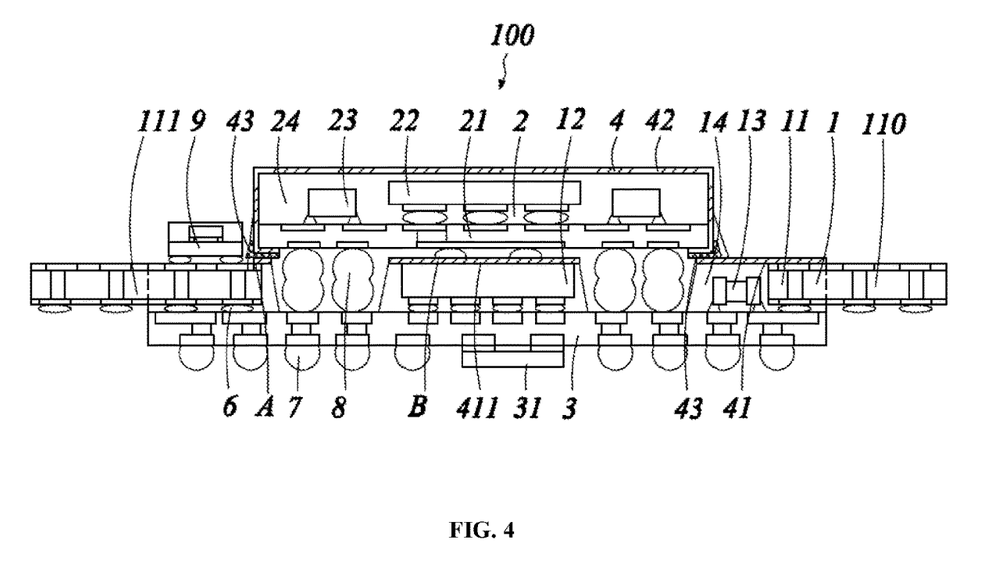
FIG. 4 is a schematic diagram of an SIP package structure according to yet another preferred embodiment of the present invention.

Alternatively, as shown in FIG. 4, the first shielding structure 41 comprises the shielding metal layer 411 disposed between the first module 1 and the second module 2. The second shielding structure 42 covers a front side and a lateral side of the second module 2. The shielding assembly 4 further comprises a conductive adhesive 43 that electrically connects the shielding metal layer 411 to the second shielding structure 42 covering the lateral side of the second module 2. Owing to the conductive adhesive 43, protection for EMI grounding and electromagnetic shielding is enhanced.

Alternatively, in some other embodiments, each of the first shielding structure 41 and the second shielding structure 42 is provided with at least one grounding point. The first module 1 and the second module 2 respectively form independent EMI shielding structures, and then are attached together.

Specifically, as shown in FIGS. 2 and 3, the first shielding structure 41 comprises the shielding metal layer 411 disposed between the first module 1 and the second module 2; at least one of the first substrate 11 and the second substrate 21 is electrically connected to the shielding metal layer 411;

and the second shielding structure 42 covers the second plastic packaging structure 24, and is electrically connected to the second substrate 21.

The following further describes the SIP package structure 100 according to the present invention in detail with reference to a plurality of specific embodiments.

Referring to FIG. 1, which shows an SIP package structure 100 according to a preferred embodiment of the present invention.

The first module 1 specifically comprises a first substrate 11, a third substrate 3, a first functional element 12, a first peripheral element 13 disposed at the periphery of the first functional element 12, and a first plastic packaging structure 14. The first functional element 12, the first substrate 11 and the first peripheral element 13 are disposed on the third substrate 3, for example, a front side of the third substrate 3. The first plastic packaging structure 14 encapsulates the first functional element 12, the first peripheral element 13 and the first substrate 11. Therefore, the overall structure is compact, and the volume is relatively small.

Specifically, the first functional element 12 is built in the inner side of the first substrate 11, and is disposed on a front-side pad of the third substrate 3 together with the first substrate 11 and the first peripheral element 13 for reflow bonding. Part of the first substrate 11 is disposed between the first functional element 12 and the first peripheral element 13.

Preferably, the first substrate 11 is provided with an accommodating cavity for accommodating the first peripheral element 13 to reduce the volume of the entire SIP package structure 100. This achieves an effect equivalent to that achieved by disposing the first peripheral element 13 in the first substrate 11.

Alternatively, the first functional element 12 and the first peripheral element 13 may be respectively attached to the inner side or the outer side of the first substrate 11.

At least one solder ball is disposed on the back side of the third substrate 3. The solder ball is used as an integrated input/output terminal of the SIP package structure 100 and is used for providing a power supply, transmitting signals, grounding and the like.

A third peripheral element 31 is also disposed on the back side of the third substrate 3.

The first shielding structure 41 comprises the shielding metal layer 411 disposed on the front side of the first module 1. The shielding metal layer 411 is electrically connected to the first substrate 11 at position A. The shielding effect is relatively good.

The second module 2 comprises a second substrate 21, a second functional element 22, a second peripheral element 23 and a second plastic packaging structure 24. The second functional element 22 and the second peripheral element 23 are disposed on a front side of the second substrate 21. The second peripheral element 23 is disposed at a periphery of the second functional element 22. The second plastic packaging structure 24 encapsulates the second functional element 22 and the second peripheral element 23. Therefore, the structure is compact.

The second substrate 21 is disposed on a side, distal from the first module 1, of the shielding metal layer 411. The filling adhesive is disposed between the second substrate 21 and the shielding metal layer 411. The second substrate 21 is electrically connected to the first substrate 11 via at least one first solder ball 5.

The shielding metal layer 411 is in electrical contact with the second substrate 21 at position B. The first shielding structure 41 comprises at least the shielding metal layer 411, part of the second substrate 21, and the first solder ball 5 that electrically connects the first substrate 11 to the second substrate 21.

The second shielding structure 42 covers a front side and a lateral side of the second module 2, thereby achieving an effective shielding effect on the second module 2.

In addition, the second shielding structure 42 further covers part of the first module 1. The second shielding structure 42 is electrically connected to the shielding metal layer 411 at position C, thereby implementing highly integral high-reliability grounding and high bonding performance, implementing an integral shielding design of a product, and improving EMI (electromagnetic shielding) performance of the product.

Further, the second shielding structure 42 further covers the lateral side of the third substrate 3. The second shielding structure 42 is electrically connected to the third substrate 3 at position D, thereby implementing grounding.

Referring to FIG. 2, which shows an SIP package structure 100 according to another preferred embodiment of the present invention. This SIP package structure 100 differs from the SIP package structure 100 shown in FIG. 1 only in the followings.

In the first module 1, part of the first peripheral element 13 is disposed adjacent to the first functional element 12. The first peripheral element 13 and the first functional element 12 share the same shielding metal layer 411. Two end parts of the shielding metal layer 411 are both electrically connected to the first substrate 11.

The first plastic packaging structure 14 further encapsulates the lateral side of the third substrate 3. A width of the first plastic packaging structure 14 on an outer side of the third substrate 3 is greater than 0 micron, preferably greater than 70 μm, to improve the package reliability.

The second shielding structure 42 covers only the second module 2; and the second shielding structure 42 is electrically connected to the second substrate 21 at position E. Therefore, the first module 1 and the second module 2 respectively form independent shielding structures, and then are connected to implement complete EMI protection.

Referring to FIG. 3, which shows an SIP package structure 100 according to still another preferred embodiment of the present invention. This SIP package structure 100 differs from the SIP package structure 100 shown in FIG. 1 only in the followings.

The SIP package structure 100 comprises only the third substrate 3, and does not comprise the first substrate 11. The first functional element 12 and the first peripheral element 13 are both attached to the third substrate 3. The third substrate 3 and the second substrate 21 are electrically connected to each other via the first metal adapter pillar 8. The first metal adapter pillar 8 electrically connects the first module 1 to the second module 2, and implements the grounding of part of the shielding assembly 4.

The shielding metal layer 411 covering the first functional element 12 is electrically connected to the second substrate 21. The shielding metal layer 411 covering the first peripheral element 13 is electrically connected to the third substrate 3 via a conductive pin of the first peripheral element 13. Therefore, a good grounding effect is achieved.

The second shielding structure 42 covers only the second module 2. End parts of the second shielding structure 42 are electrically connected to the shielding metal layer 411 at position F. Therefore, the first module 1 and the second module 2 respectively form independent shielding structures, and then are connected to implement complete EMI protection.

The shielding assembly 4 further comprises an integral shielding structure 45 that integrally covers the first module 1, the second module 2 and the third substrate 3.

Other structures as well as connection manners and effects thereof are not described herein.

Referring to FIG. 4, which shows an SIP package structure 100 according to yet another preferred embodiment of the present invention. This SIP package structure 100 differs from the SIP package structure 100 shown in FIG. 3 only in the followings.

The SIP package structure 100 comprises a first substrate 11. The first substrate 11 comprises an extending substrate 111 extending out of the first plastic packaging structure 14. In other words, the extending substrate 111 is not sealed by the first plastic packaging structure 14. The extending substrate 111 is first substrates 11 of adjacent first modules 1 on the same substrate in a preparation process of the first module 1, that is, two adjacent first modules 1 use the same adapter block 110. The adapter block 110 is finally cut into the first substrates 11 in the first modules 1. A lateral side (shown by a dashed line in the figure) of the first substrate 11 is exposed.

In this embodiment, the first plastic packaging structure 14 does not comprise the first substrate 11. The first functional element 12 and the first peripheral element 13 are both attached to the third substrate 3. The third substrate 3 and the second substrate 21 are electrically connected to each other via the first metal adapter pillar 8. The first substrate 11 and the third substrate 3 are electrically connected to each other outside the first plastic packaging structure 14 via the second solder ball 6.

The SIP package structure 100 further comprises an external package body that is disposed on the extending substrate 111 and/or a functional element 9 that does not need to be packaged with plastics. The external package body, other functional elements that do not need to be packaged with plastics, and the first functional element 12 share a substrate to reduce costs or avoid impact on a function, such as an antenna function, of the external package body and/or the functional element 9 that does not need to be packaged with plastics.

The other functional elements that do not need to be packaged with plastics comprise but not limited to a pressure-sensitive BAW/SAW filter, MEMS device, B2B connector, photoelectric connection coupler and the like, and are disposed and bonded on the substrate 11 without being packaged with plastics.

The shielding metal layer 411 covering the first peripheral element 13 is electrically connected to the first substrate 11 at a periphery of the first peripheral element 13.

The shielding assembly 4 further comprises the conductive adhesive 43 that electrically connects the shielding metal layer 411 to the second shielding structure 42, to enhance protection on EMI grounding and electromagnetic shielding. Specifically, the second shielding structure 42 on the lateral side of the second module 2 is connected to the first shielding structure 41 via the conductive adhesive 43.

Other structures as well as connection manners and effects thereof are not described herein.

Figure 5:
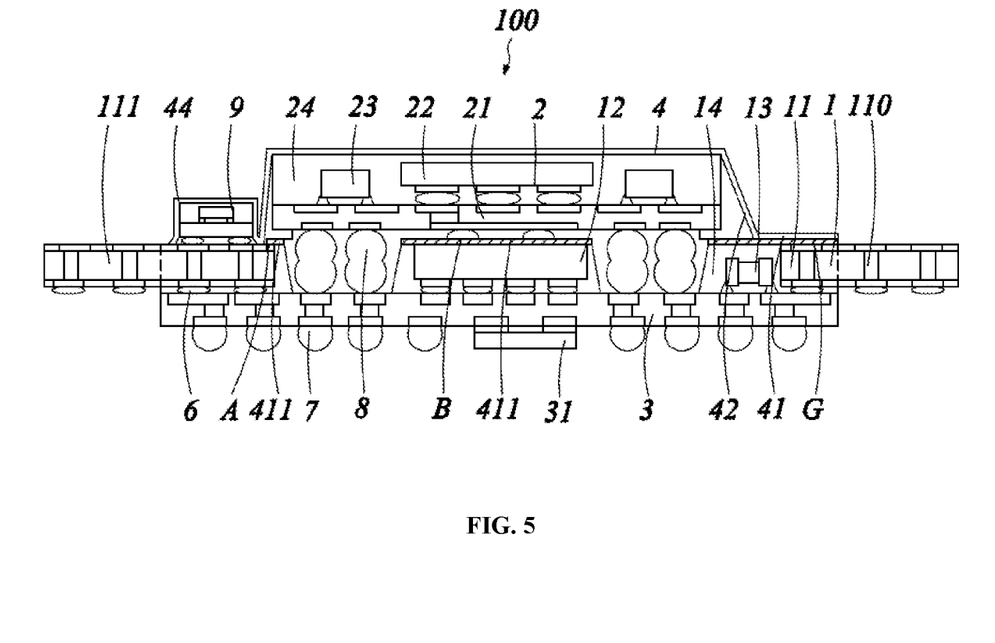
FIG. 5 is a schematic diagram of an SIP package structure according to still yet another preferred embodiment of the present invention.

Referring to FIG. 5, which shows an SIP package structure 100 according to still yet another preferred embodiment of the present invention. This SIP package structure 100 differs from the SIP package structure 100 shown in FIG. 4 only in the followings.

The shielding assembly 4 further comprises a third shielding structure 44 covering a functional element that does not need secondary plastic packaging, such as a pressure-sensitive BAW/SAW filter. The third shielding structure 44 is a part of the second shielding structure 42. The second shielding structure 42 further covers the lateral side of the first substrate 11 that is exposed outside.

Specifically, the third shielding structure 44 and the second shielding structure 42 are made of the same shielding material and are electrically connected to each other, and may be disposed integrally. In addition, the second shielding structure 42 further covers the peripheral side of the first module 1; and the second shielding structure 42 is electrically connected to the first shielding structure 41 at position G, thereby implementing highly integral high-reliability grounding and high bonding performance, implementing an integral shielding design of a product, and improving EMC performance of the product.

Other structures as well as connection manners and effects thereof are not described herein.

Certainly, in the embodiment, shown in FIG. 1 or 2, in which the first plastic packaging structure 14 comprises the first substrate 11, the SIP package structure 100 may further comprise the extending substrate 111, the external package body, and/or the functional element 9 that does not need to be packaged with plastics. In addition, the SIP package structure 100 may further comprise the third shielding structure 44.

In summary, for the SIP package structure 100 according to the present invention, modules and devices that have different frequency sensitivities are respectively processed by using different electromagnetic shielding technologies, then horizontally or vertically stacked, and finally packaged in an integrated manner. Therefore, different electromagnetic shielding requirements for different secondary modules or SOC chips are met. Particularly, a pressure-sensitive device, such as a BAW/SAW filter, an MEMS device, a B2B connector, or a photoelectric connection coupler, is disposed and bonded on a substrate of a main module without being packaged with plastics. Therefore, different requirements of all components are met, and the overall structure is compact.

It should be understood that although the description is described based on the embodiments, not every embodiment comprises only one independent technical solution. This statement of the description is only for clarity. Those skilled in the art should treat the description as a whole, and technical solutions in all of the embodiments may also be properly combined to form other embodiments that will be understood by those skilled in the art.

The above detailed description only aims to specifically illustrate the available embodiments of the present invention, and is not intended to limit the protection scope of the present invention. Equivalent embodiments or modifications made without departing from the spirit of the present invention shall fall within the protection scope of the present invention.

What is claimed is:

1. An SIP package structure, comprising a first module and a second module, the first module and the second module are vertically stacked, wherein electromagnetic sensitive frequencies of the first module and the second module are different; the SIP package structure further comprises a shielding assembly; the shielding assembly comprises a first shielding structure covering the first module and a second shielding structure covering the second module; and at least one part of the first shielding structure or a part of the second shielding structure is disposed between the first module and the second module; wherein the first module and the second module have at least one element with different electromagnetic sensitivity frequencies; and the second module is disposed on a front side of the first module; and at least part of the first shielding structure is disposed between the first module and the second module; and the first shielding structure comprises a shielding metal layer disposed between the first module and the second module; and the second shielding structure covers a front side and a lateral side of the second module, and a bottom end of a second shielding structure encompassing a side of said second module is bent inwardly or outwardly and electrically connected in face contact to the shielding metal layer below it.

2. The SIP package structure according to claim 1, wherein the first shielding structure and the second shielding structure are made of different materials, or the first shielding structure and the second shielding structure have different structures, or the first shielding structure and the second shielding structure are made of different materials and have different structures.

3. The SIP package structure according to claim 1, wherein the first shielding structure and/or the second shielding structure are/is provided with at least one grounding point.

4. The SIP package structure according to claim 3, wherein the first module comprises a first substrate, a third substrate, a first functional element, a first peripheral element and a first plastic packaging structure, wherein the first functional element, the first substrate and the first peripheral element are disposed on the third substrate; the first plastic packaging structure encapsulates the first functional element, the first peripheral element and the first substrate; and the first shielding metal layer is disposed on a front side of the first plastic packaging structure;

the second module comprises a second substrate, a second functional element, a second peripheral element and a second plastic packaging structure, wherein the second functional element and the second peripheral element are disposed on a front side of the second substrate; the second plastic packaging structure encapsulates the second functional element and the second peripheral element; and the second shielding structure covers the second plastic packaging structure; and the shielding metal layer is electrically connected to at least one of the first substrate and the second substrate.

5. The SIP package structure according to claim 3, wherein the second module; the second shielding structure further comprises an additional shielding structure capable of covering part of a lateral side of the first module; and the additional shielding structure is electrically connected to the shielding metal layer.

6. The SIP package structure according to claim 3, wherein the shielding assembly further comprises a conductive adhesive that electrically connects the shielding metal layer to the second shielding structure covering the lateral side of the second module.

7. The SIP package structure according to claim 1, wherein each of the first shielding structure and the second shielding structure is provided with at least one grounding point.

8. The SIP package structure according to claim 7, wherein the first module comprises a first substrate, a third substrate, a first functional element, a first peripheral element and a first plastic packaging structure, wherein the first functional element, the first substrate and the first peripheral element are disposed on the third substrate; and the first plastic packaging structure encapsulates the first functional element, the first peripheral element and the first substrate;

the second module comprises a second substrate, a second functional element, a second peripheral element and a second plastic packaging structure, wherein the second functional element and the second peripheral element are disposed on a front side of the second substrate; and the second plastic packaging structure encapsulates the second functional element and the second peripheral element; and the at least one of the first substrate and the second substrate is electrically connected to the shielding metal layer; and the second shielding structure covers the second plastic packaging structure and is electrically connected to the second substrate.

9. The SIP package structure according to claim 1, wherein the first module comprises a first substrate, a third substrate, a first functional element, a first peripheral element and a first plastic packaging structure, wherein the first functional element, the first substrate and the first peripheral element are disposed on the third substrate; and the first plastic packaging structure encapsulates the first functional element, the first peripheral element and the first substrate;

the second module comprises a second substrate, a second functional element, a second peripheral element and a second plastic packaging structure, wherein the second functional element and the second peripheral element are disposed on a front side of the second substrate; and the second plastic packaging structure encapsulates the second functional element and the second peripheral element;

the first substrate is connected to the second substrate via at least one first solder ball; and at least one third solder ball is disposed on a back side of the third substrate.

10. The SIP package structure according to claim 1, wherein the first module comprises a third substrate, a first functional element, a first peripheral element and a first plastic packaging structure, wherein the first functional element and the first peripheral element are disposed on the third substrate; and the first plastic packaging structure encapsulates the first functional element and the first peripheral element;

the second module comprises a second substrate, a second functional element, a second peripheral element and a second plastic packaging structure, wherein the second functional element and the second peripheral element are disposed on a front side of the second substrate; and the second plastic packaging structure encapsulates the second functional element and the second peripheral element; and the third substrate and the second substrate are electrically connected to each other via a first metal adapter pillar.

11. The SIP package structure according to claim 9, wherein the first plastic packaging structure further covers a lateral side of the third substrate; and a width of the first plastic packaging structure disposed on the lateral side of the third substrate is not less than 70 μm.

12. The SIP package structure according to claim 10, wherein the SIP package structure further comprises a third peripheral element disposed on the back side of the third substrate.

13. The SIP package structure according to claim 1, wherein the first module comprises a first substrate, a third substrate, a first functional element, a first peripheral element and a first plastic packaging structure, wherein the first functional element, the first substrate and the first peripheral element are disposed on the third substrate;

and the first plastic packaging structure encapsulates the first functional element and the first peripheral element; and the first substrate comprises an extending substrate extending out of the first plastic packaging structure; and the SIP package structure further comprises an external package body that is disposed on the extending substrate and/or a functional element that does not need to be packaged with plastics.

14. The SIP package structure according to claim 13, wherein the shielding assembly further comprises a third shielding structure that covers the external package body and/or the functional element that does not need to be packaged with plastics; and at least one of the first shielding structure or the second shielding structure is electrically connected to the third shielding structure.

15. An SIP package structure, comprising a first module and a second module, the first module and the second module are horizontally distributed or vertically stacked, wherein the first module and the second module have at least one element with different electromagnetic sensitivity frequencies; the SIP package structure further comprises a shielding assembly; the shielding assembly comprises a first shielding structure covering the first module and a second shielding structure covering the second module; and at least one part of the first shielding structure or part of the second shielding structure is disposed between the first module and the second module; wherein the first shielding structure is electrically connected to the second shielding structure; and at least one of the first shielding structure or the second shielding structure is provided with at least one grounding point, wherein the first shielding structure comprises a shielding metal layer disposed between the first module and the second module; and the second shielding structure covers a front side and a lateral side of the second module; and an end part of the second shielding structure is electrically connected to the shielding metal layer, or the shielding assembly further comprises a conductive adhesive that electrically connects the shielding metal layer to the second shielding structure covering the lateral side of the second module.

16. An SIP package structure, comprising a first module and a second module, the first module and the second module are horizontally distributed or vertically stacked, wherein the first module and the second module have at least one element with different electromagnetic sensitivity frequencies; the SIP package structure further comprises a shielding assembly; the shielding assembly comprises a first shielding structure covering the first module and a second shielding structure covering the second module; and at least one part of the first shielding structure or part of the second shielding structure is disposed between the first module and the second module; wherein the first shielding structure is electrically connected to the second shielding structure; and at lease of the first shielding structure or the second shielding structure are/is provided with at least one grounding point; and wherein the first module comprises a first substrate, a third substrate, a first functional element, a first peripheral element and a first plastic packaging structure, wherein the first functional element, the first substrate and the first peripheral element are disposed on the third substrate; and the first plastic packaging structure encapsulates the first functional element and the first peripheral element; and the first substrate comprises an extending substrate extending out of the first plastic packaging structure; and the SIP package structure further comprises an external package body that is disposed on the extending substrate and/or a functional element that does not need to be packaged with plastics.

* * * * *